(12) United States Patent
Hu et al.

(10) Patent No.: US 8,471,719 B2
(45) Date of Patent: Jun. 25, 2013

(54) PRESSURE CONTROL SWITCH, METHOD FOR USING THE SAME AND ALARM SYSTEM USING THE SAME

(75) Inventors: Chun-Hua Hu, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 341 days.

(21) Appl. No.: 12/911,897

(22) Filed: Oct. 26, 2010

(65) Prior Publication Data
US 2011/0181430 A1 Jul. 28, 2011

(30) Foreign Application Priority Data
Jan. 22, 2010 (CN) .......................... 2010 1 0102132

(51) Int. Cl.
*G08B 21/00* (2006.01)

(52) U.S. Cl.
USPC .............................. 340/657; 73/763; 345/158

(58) Field of Classification Search
USPC .... 340/657, 665; 73/763; 200/85 R; 252/511; 338/47; 345/158
See application file for complete search history.

(56) References Cited

U.S. PATENT DOCUMENTS

| | | | | |
|---|---|---|---|---|
| 5,695,859 | A * | 12/1997 | Burgess | 340/973 |
| 6,717,568 | B1 * | 4/2004 | Takatuka et al. | 345/156 |
| 7,594,442 | B2 * | 9/2009 | Kaiserman et al. | 73/763 |
| 8,228,162 | B2 * | 7/2012 | Yoshihara et al. | 338/47 |

* cited by examiner

*Primary Examiner* — John A Tweel, Jr.
(74) *Attorney, Agent, or Firm* — Altis Law Group, Inc.

(57) ABSTRACT

The present disclosure relates to a pressure control switch. The pressure control switch includes a bistable resistance element. The bistable resistance element includes an organic, soft, low-conductivity matrix, and a plurality of high conductivity particles dispersed in the matrix. The bistable resistance element switches from a low resistance state to a high resistance state by receiving a pressure change applied to the bistable resistance element. The present disclosure also relates to a method for using the pressure control switch and an alarm system.

19 Claims, 12 Drawing Sheets

US 8,471,719 B2

PRESSURE CONTROL SWITCH, METHOD FOR USING THE SAME AND ALARM SYSTEM USING THE SAME

CROSS-REFERENCE TO RELATED APPLICATIONS

This application claims all benefits accruing under 35 U.S.C. §119 from China Patent Application No. 201010102132.7, filed on Jan. 22, 2010 in the China Intellectual Property Office, the contents of which are hereby incorporated by reference.

BACKGROUND

1. Technical Field

The present disclosure relates to pressure control switches, methods, and alarm systems using the same.

2. Description of Related Art

Pressure control switches not only sense pressure applied thereto, but also switch from an off state to an on state if the pressure is larger or smaller than a desired value, and maintains the on state even if the pressure is unloaded. Pressure control switches have been utilized in many fields where a pressure action is to be monitored, such as burglar alarms, cars, houses, and pressure alarms of machines.

To maintain the on state, logical operation chips or circuits with complicated logical operating elements are used to accompany pressure sensors in the pressure control switches. The pressure sensors send pressure signals to the chips or circuits. The chips or circuits compare values of the pressure signals with desired values to switch and maintain the on and off states of the pressure control switches.

What is needed, therefore, is to provide a pressure control switch having a simpler structure, a method for using the same, and an alarm system using the same.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another", "an", or "one" embodiment in this disclosure are not necessarily to the same embodiment, and such references mean at least one.

One embodiment of a pressure control switch includes a bistable resistance element. The bistable resistance element has two switchable table resistance states, a high resistance state and a low resistance state. In the high resistance state, the bistable resistance element has a high resistance. In the low resistance state, the bistable resistance element has a low resistance. The bistable resistance element switches from the high resistance state to the low resistance state when receiving an electric signal applied to the bistable resistance element. The electric signal can be at least one of a current, a voltage, and an electric field having a sufficient value to convert the bistable resistance element from the high resistance state to the low resistance state. The bistable resistance element switches from the low resistance state to the high resistance state by simply receiving a pressure change applied to the bistable resistance element. The pressure change has a sufficient value to convert the bistable resistance element from the low resistance state to the high resistance state. A ratio of the high resistance to the low resistance of the bistable resistance element may be equal to or larger than about 50:1 to about 100:1. In one embodiment, the ratio is in a range from about 1,000:1 to about 10,000:1.

Figure 1:
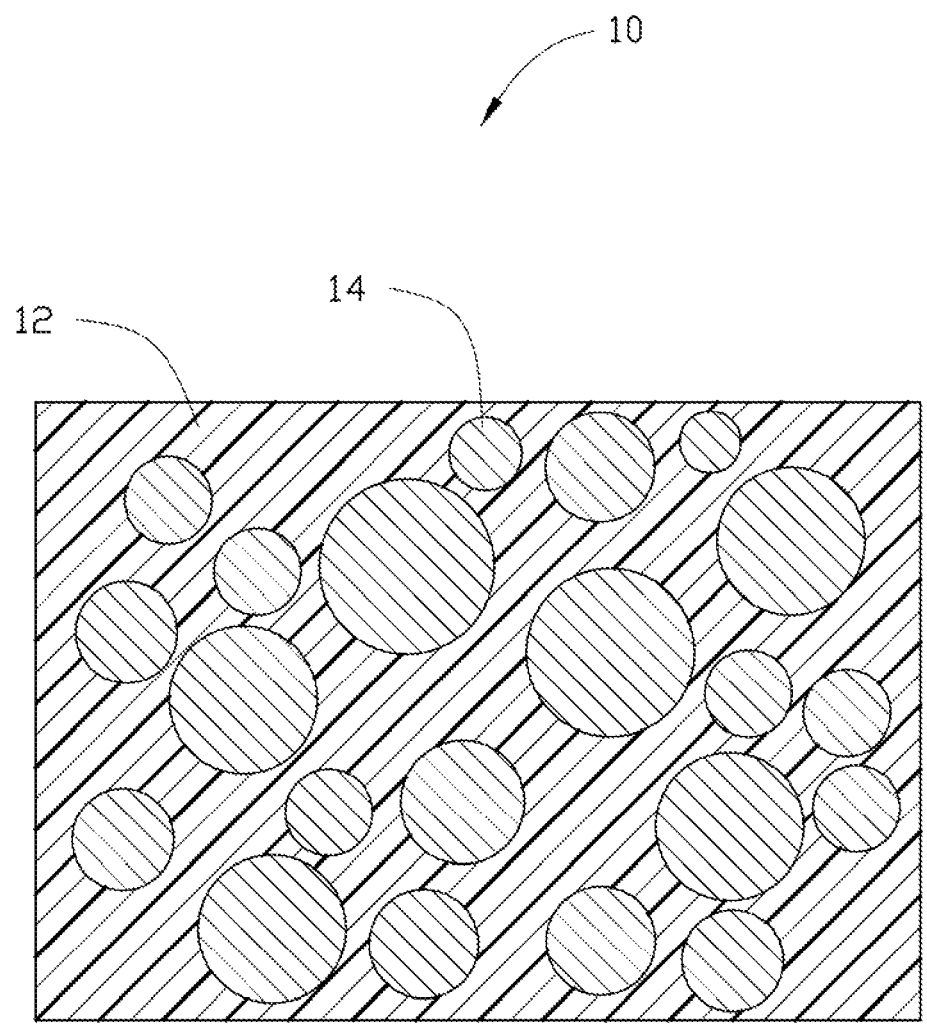
FIG. 1 is a structure view of an embodiment of a bistable resistance element of a pressure control switch.

Referring to FIG. 1, a bistable resistance element 10 includes a soft organic low-conductivity matrix 12 and a sufficient amount of high conductivity particles 14 dispersed in the matrix 12 to render the bistable resistance element 10 switchable between the low resistance state and the high resistance state.

The high conductivity particles 14 can be metal particles. The material of the metal particles can be pure metals and/or metal alloys, such as gold, silver, nickel, tin, iron, copper, and platinum. The diameter of the metal particles can be in a range from about 1 nanometer to about 100 microns. In one embodiment, the diameter of the metal particles is in a range from about 2 nanometers to about 20 microns. A volume percent of the metal particles in the bistable resistance element 10 can be in a range from about 5% to about 40%. In one embodiment, the volume percent of the metal particles in the bistable resistance element 10 is in a range from about 9% to about 11%. The material, diameter, and volume percent in the bistable resistance element 10 of the high conductivity particles 14 affect the sensitivity of the bistable resistance element 10 and can be set as desired. The filaments can be formed simply by receiving the electric signal and can be broken simply by receiving the pressure change.

The organic, soft, low-conductivity matrix 12 carries and supports the plurality of metal particles, and has a sufficient responsive deformation according to the pressure change applied thereto, enabling the breakage of the filaments. The matrix 12 may be an elastic or a flexible insulating material. The material of the matrix 12 can be a polymer such as elastomers, silicone rubbers, polyethylene glycol (PEG), polypropylene (PP), polyesters, epoxy resins, hypoxia glues, and acrylic resins. The elastic modulus of the matrix 12 can be in a range from about 0.01 Pa to about 0.1 Pa. A ratio of the elastic modulus of the metal particles to the elastic modulus of the matrix 12 may be equal to or greater than 2000:1.

Figure 2:
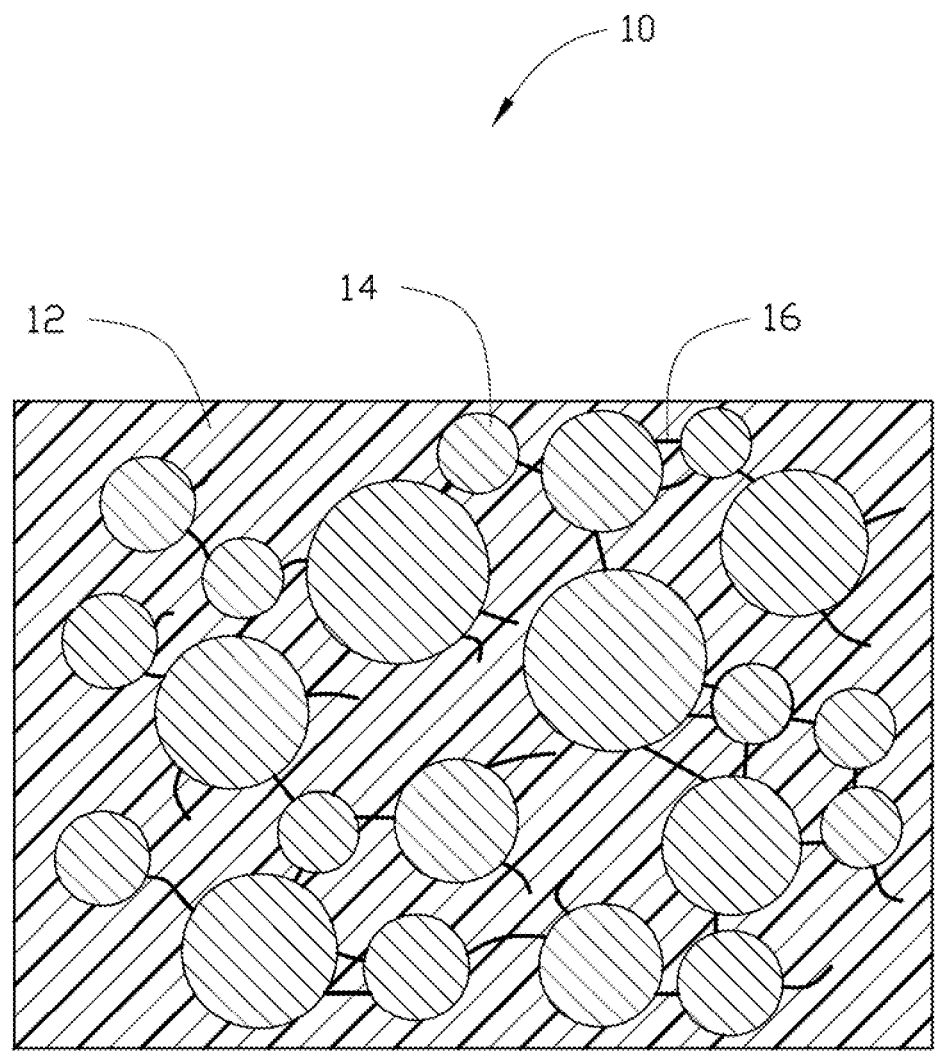
FIG. 2 is a structure view of an embodiment of the bistable resistance element having electrical conducting paths therein.

Referring to FIG. 2, at the low resistance state, the bistable resistance element 10 further includes a plurality of high conductivity filaments 16 extending from surfaces of the high conductivity particles 14 formed by applying the electric signal to the bistable resistance element 10. The high conductivity filaments 16 are grown from the high conductivity particles 14. The material of the high conductivity filaments 16 can be pure metals and/or metal alloys corresponding to the material of the metal particles. The high conductivity filaments 16 may have a diameter of about 1 nanometer to about 100 nanometers, and a length of about 0.1 microns to about 100 microns. The high conductivity filaments 16, extending from one high conductivity particle may be in contact with the high conductivity filaments 16 extending from other high conductivity particles 14 and/or directly contacting with other high conductivity particles 14. Electrical conducting paths are formed between the high conductivity particles 14 by the high conductivity filaments 16. Thus, an electrical conducting network is formed in the bistable resistance element 10 including both the high conductivity particles 14 and the high conductivity filaments 16 electrically connecting the high conductivity particles 14 together. Therefore, the bistable resistance element 10 having the high conductivity filaments 16 is in the low resistance state.

Figure 3:
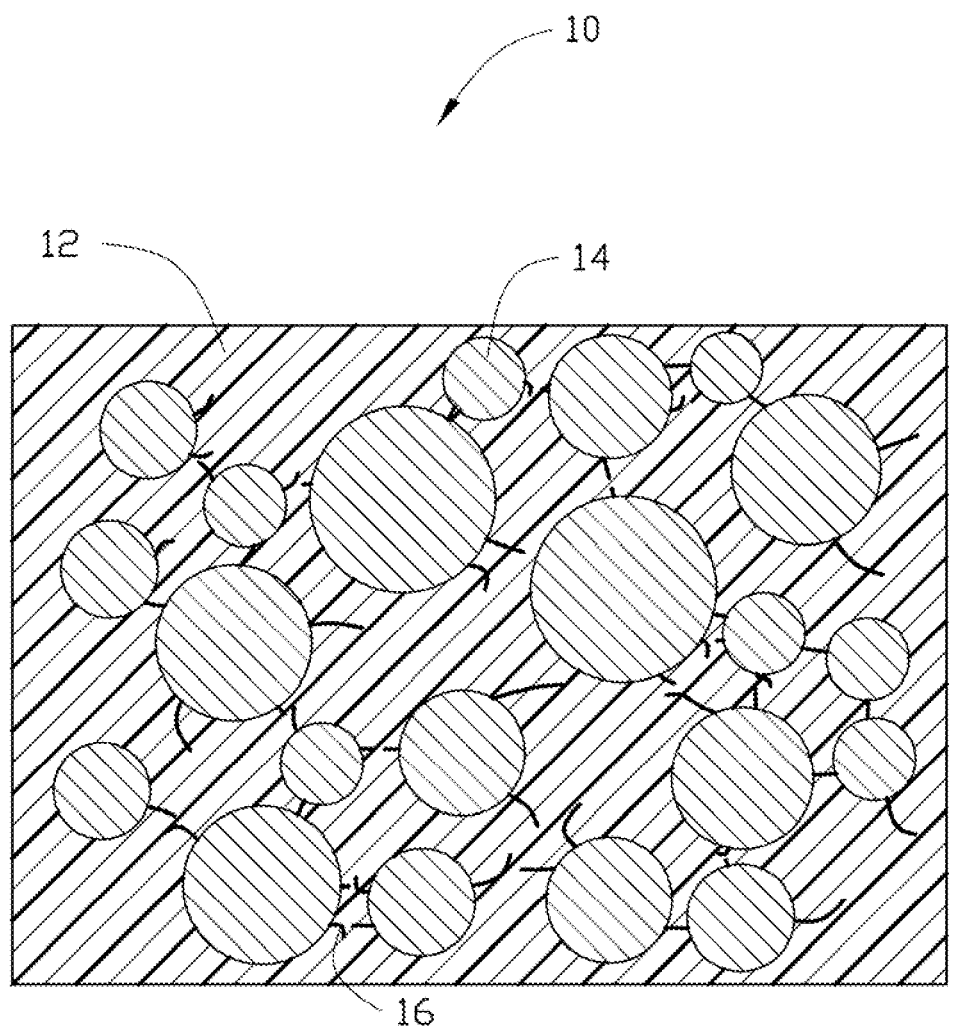
FIG. 3 is a structure view of an embodiment of the bistable resistance element having broken filaments therein.

Referring to FIG. 3, in the high resistance state, at least some of the conductivity filaments 16 are broken by the deformation of the matrix 12, thus, electrically disconnecting the high conductivity particles 14. The deformation may be by shape and/or size of the matrix 12. For example, the matrix 12 can be extended, elongated, contracted, twisted, bent, pressed, pushed, pulled, and/or be squeezed. The deformation may not occur externally in the shape and/or size of the matrix 12, but may occur inside the matrix 12. For example, the deformation of the matrix 12 can be achieved by vibration or by a pressure changing circumstance. In one embodiment, the deformation of the matrix 12 causes the relative positions and/or relative distances among the high conductivity particles 14 to change, thereby breaking at least some of the filaments 16.

The deformation may occur at any time if the bistable resistance element 10 is at the low resistance state, and a sufficient deformation successfully breaks some of the filaments 16, such that the bistable resistance element 10 switches to a high resistance state. The sufficient deformation can be caused by the sufficient pressure change applied to the matrix 12. The pressure change (i.e., $\Delta P$) is a change from one pressure value to another pressure value applied to the bistable resistance element 10. If the $\Delta P$ is larger than or equal to a critical value (i.e., $\Delta P_{min}$), the $\Delta P$ is sufficient enough to produce a deformation to break the at least some of the filaments 16, thus switching the bistable resistance element 10 from a low resistance state to the high resistance state. During a switch from the low resistance state to the high resistance state, the sufficient change in pressure can be determined by the following equation, $\Delta P = |PV_{high} - PV_{low}| \geq \Delta P_{min}$, wherein $PV_{low}$ is the pressure value applied to the bistable resistance element 10 at the low resistance state, and $PV_{high}$ is the pressure value applied to the bistable resistance element 10 at the high resistance state. The filaments 16 are formed under the $PV_{low}$. At least some of the filaments 16 are broken if the $PV_{low}$ is changed to the $PV_{high}$. In one embodiment, the filaments 16 are formed under a $PV_{low}$ of about 20 Pa, and broken if the pressure applied to the bistable resistance element 10 changes from the $PV_{low}$ of about 20 Pa to a $PV_{high}$ of about 15 Pa, the sufficient $\Delta P$ being about 5 Pa.

It is to be understood that the filaments 16 can be formed under one atmospheric pressure (i.e., the $PV_{low}$=1 atmospheric pressure), and for different switches, the $PV_{low}$ can have the same or different values. In one embodiment, an additional pressure may have already been applied to the bistable resistance element 10 when the filaments 16 are formed to achieve a higher $PV_{low}$. In another embodiment, the bistable resistance element 10 may be placed in a vacuum when the filaments 16 are formed to achieve a lower $PV_{low}$. No matter the value of the $PV_{low}$, if the pressure is not changed to achieve the sufficient deformation, the filaments 16 would not be broken.

The bistable resistance element 10 may switch between the high resistance state and the low resistance state more than once with different $PV_{high}$ and different $PV_{low}$. For example, the bistable resistance element 10 first switches from the low resistance state to the high resistance state when the $PV_{low}$ is about 20 Pa and the $PV_{high}$ is about 15 Pa. Under the pressure of 15 Pa, the electric signal can be applied to the bistable resistance element 10 to switch the high resistance state back to the low resistance state. Therefore, the $PV_{low}$ is about 15 Pa when the bistable resistance element 10 switches back to the low resistance state. The $PV_{low}$ is determined by the pressure value applied to the bistable resistance element 10 when the filaments 16 are formed by the electric signal, and can have different values at different switches. For different $PV_{low}$, the bistable resistance element 10 may have different sufficient $\Delta P$.

The pressure change can be applied by any suitable means, such as a pressure excitation element, a testing apparatus such as a machine and a human body, or a particular circumstance (e.g., an oven) which has the bistable resistance element 10 therein. For example, a cough toward to the bistable resistance element 10, a touch on the bistable resistance element 10, or a vibration near the bistable resistance element 10 can induce the pressure change.

The high resistance of the bistable resistance element 10 at the high resistance state is caused by a mechanical breakage of the filaments 16 (i.e., mechanical disconnection between the high conductivity particles 14). Therefore, the bistable resistance element 10 can never switch to the low resistance state until a sufficient electric signal is applied to the bistable resistance element 10 and new filaments 16 are formed from the surfaces of the high conductivity particles 14 in the matrix 12. The pressure change can be a momentary signal. If the $PV_{high}$ is changed back to equal the $PV_{low}$ after at least some of filaments 16 are broken, the high resistance state would not switch to the low resistance state. That is to say, the bistable resistance element 10 maintains its current state unless a sufficient electric signal is applied to the bistable resistance element 10 to renew the bistable resistance element 10 and switch the bistable resistance element 10 from the high resistance state to the low resistance state.

The bistable resistance element 10 may have an initial state in which the conductivity filaments 16 may not have been formed in the bistable resistance element 10 and a majority of the high conductivity particles 14 are electrically separated from each other in the matrix 12. Thus, the bistable resistance element 10 would have a high resistance.

Figure 4:
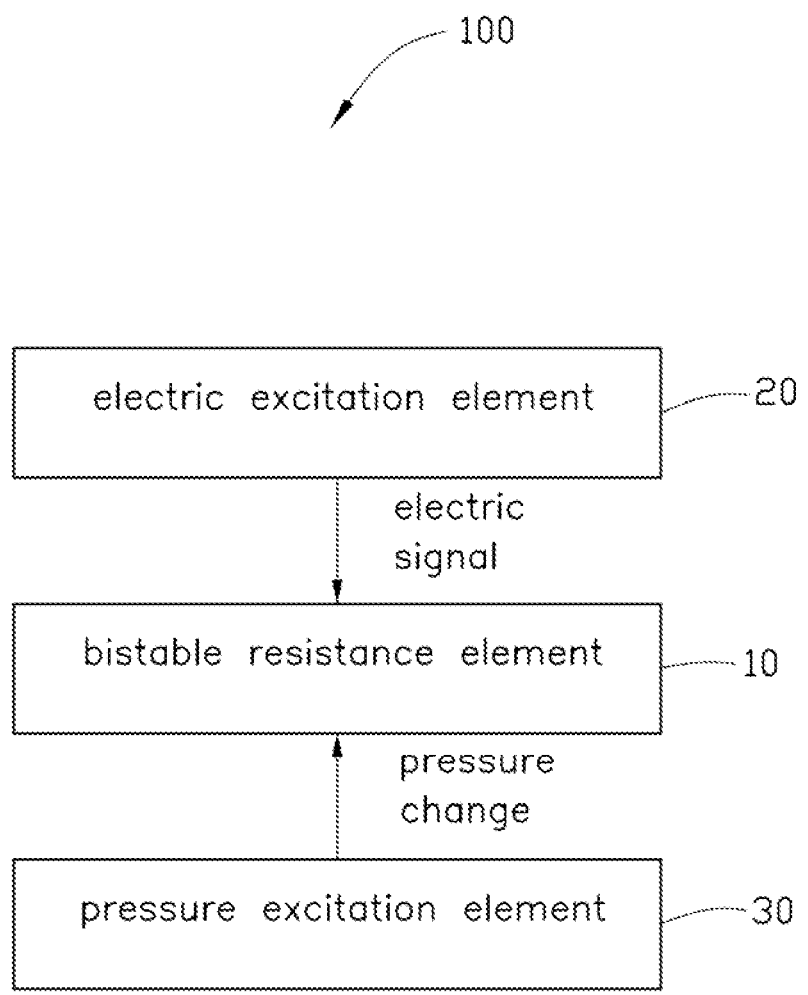
FIG. 4 is a schematic view of an embodiment of a pressure control switch.

Referring to FIG. 4, a pressure control switch 100 may further include an electric excitation element 20, and/or a pressure excitation element 30.

The electric excitation element 20 is to produce the electric signal, such as the current, voltage, and electric field applied to the bistable resistance element 10. The intensity of the electric field may be in a range from about 0.1 volt per millimeters (V/mm) to about 100 V/mm. The bistable resistance element 10 may be disposed in the electric field produced by the electric excitation element 20. In one embodiment, the electric excitation element 20 may be a plate capacitor. The bistable resistance element 10 is located between two plates of the plate capacitor. In another embodiment, the electric excitation element 20 may be electrically connected to the bistable resistance element 10 to electrically conduct the current and voltage to the bistable resistance element 10.

The electric excitation element 20 may be an electric pulse signal producing device, the electric signal being a pulse electric field having a width of about 1 millisecond to 10 seconds and an intensity of about 0.3 V/mm to about 3 V/mm.

The pressure excitation element 30 produces a pressure change on the bistable resistance element 10. The pressure excitation element 30 can be a test object such as a person, a machine, or a sealed container containing a gas therein.

Figure 5:
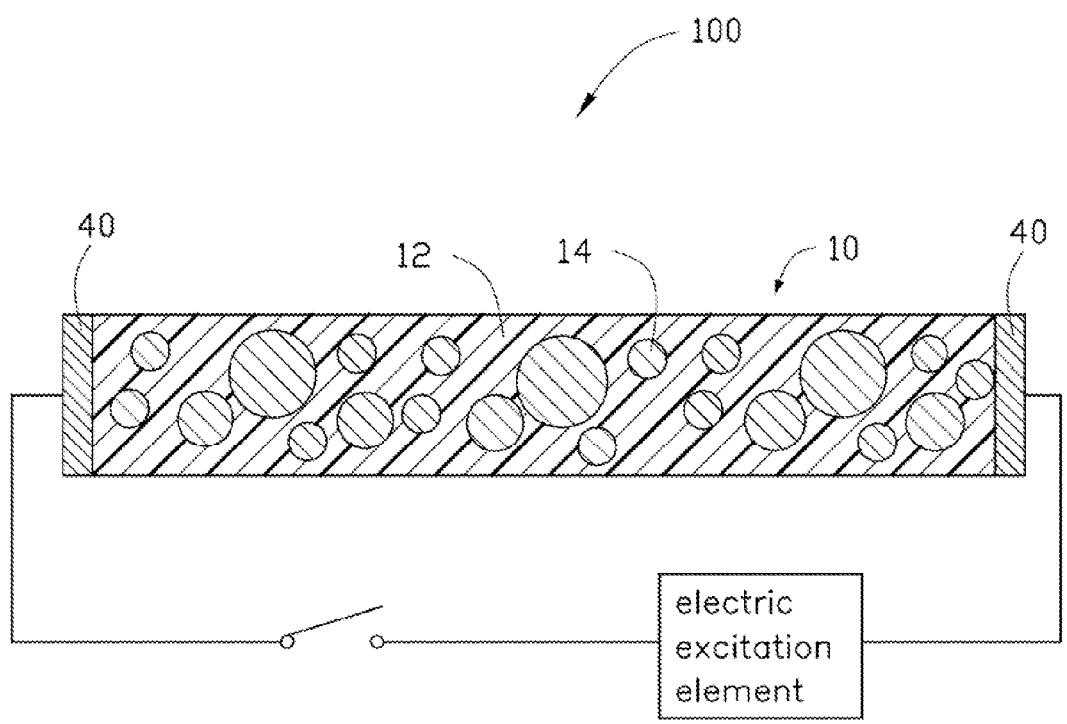
FIG. 5 is a schematic view of another embodiment of the pressure control switch.

Referring to FIG. 5, the pressure control switch 100 may further include two electrodes 40 electrically connecting the electric excitation element 20 to the bistable resistance element 10. The two electrodes 40 may be located on opposite surfaces of the bistable resistance element 10. The material of the two electrodes 40 can be at least one of metals, conducting resins, and carbon nanotubes. In one embodiment, the material of the two electrodes 40 is silver paste. The distance between the two electrodes 40 can be set as desired. The two electrodes 40 can be located on two opposite sides of the longest axis of the bistable resistance element 10.

The bistable resistance element 10 of the pressure control switch 100 switches between the high resistance state and the low resistance state by using the electric signal and the pressure change applied thereto. The pressure control switch 100 does not need a complicated electrical circuit to switch and hold the ON/OFF states, but using pressure change to affect the resistance of the bistable resistance element 10, thereby accomplishing the function of the switch. The pressure change can switch and hold the bistable resistance element 10 at the high resistance state until the bistable resistance element 10 is renewed to the low resistance state by the electric signal. The pressure control switch 100 has a simpler structure and can be used in many fields where pressure change is needed to be sensed or monitored.

A method for using the pressure control switch 100 includes steps of:

S101, providing the bistable resistance element 10;

S102, applying the electric signal to the bistable resistance element 10 to have the bistable resistance element 10 at the low resistance state; and S103, sensing the pressure change by switching the low resistance state to the high resistance state of the bistable resistance element 10.

In step S102, the bistable resistance element 10 is located in a working circumference having a working pressure (i.e., $PV_{low}$). Under this working pressure, the electric signal is applied to the bistable resistance element 10 to grow the filaments 16 in the matrix 12.

In step S103, if the pressure change of the working circumference is larger than or equal to the $\Delta P_{min}$, the filaments 16 are at least partially broken, to switch the bistable resistance element 10 to the high resistance state. An additional step of renewing the bistable resistance element 10 by applying the electric signal to the bistable resistance element 10 to switch the bistable resistance element 10 from the high resistance state to the low resistance state can be further processed after step S103. The working pressure can be an atmospheric pressure of about $1.01 \times 10^5$ Pa.

Figure 6:
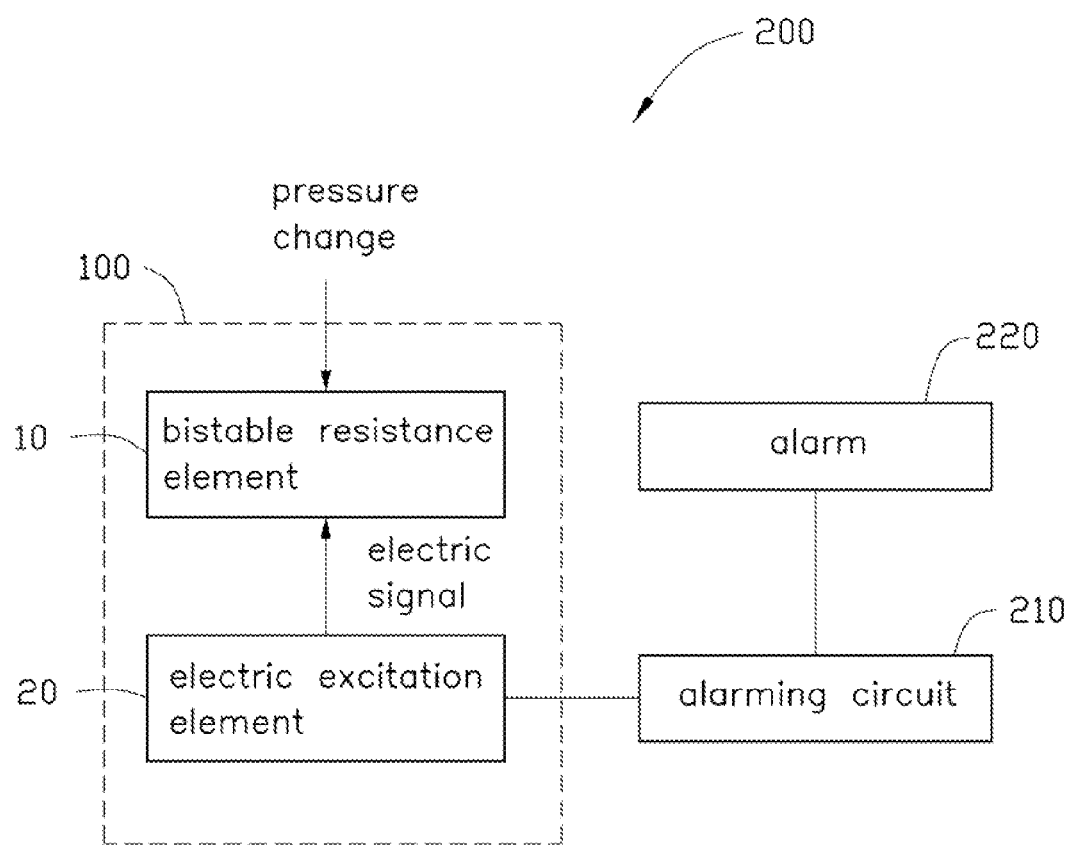
FIG. 6 is a schematic view of an embodiment of an alarm system.

Referring to FIG. 6, an alarm system 200 includes the pressure control switch 100, an alarming circuit 210, and an alarm 220. The pressure control switch 100 and the alarm 220 are electrically connected with the alarm circuit 210. The pressure control switch 100 may include the bistable resistance element 10 and the electric excitation element 20. The alarm circuit 220 may include a power source. When the bistable resistance element 10 is at the high resistance state, the alarm circuit 210 powers the alarm 220. The bistable resistance element 10 can be renewed by the electric excitation element 20.

Example 1

Figure 7:
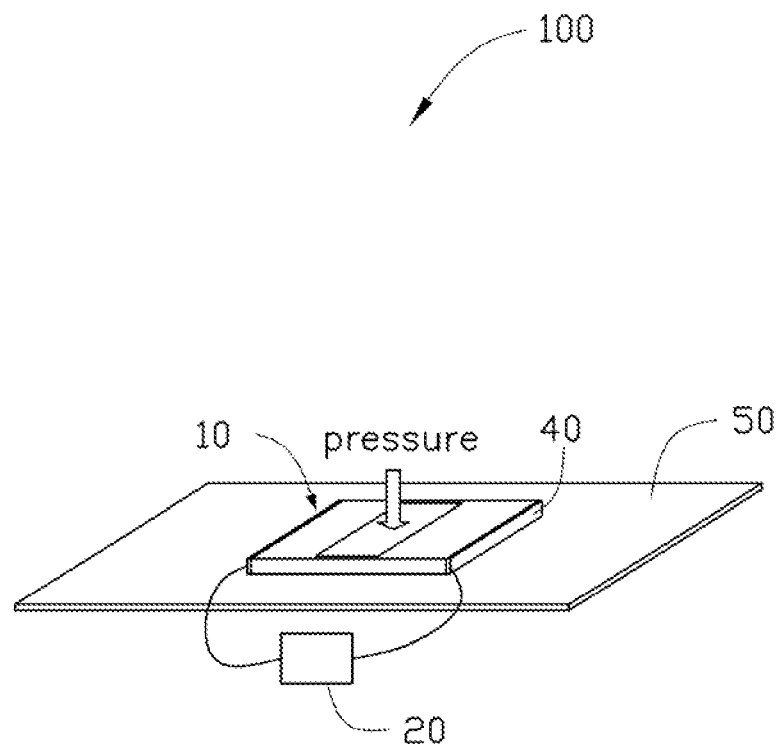
FIG. 7 is an isometric view of an embodiment of a pressure control switch having pressure applied thereto.

Referring to FIG. 7, the pressure control switch 100 of example 1 including the bistable resistance element 10, two electrodes 40, and one electric excitation element 20, is assembled and tested. In the bistable resistance element 10, the material of the matrix 12 is polydimethyl siloxane (PDMS) with an elastic modulus of about 0.01 Pa to about 0.1 Pa, and the material of the metal particles is nickel. The diameter of the nickel particles is from about 1 micron to about 6 microns. The volume percentage of the nickel particles in the bistable resistance element 10 is in a range from about 9% to about 11%.

The bistable resistance element 10 has a rectangular layer shape and is disposed on a surface of a glass board 50. The two electrodes 40 are silver paste layers formed on two side surfaces of the bistable resistance element 10.

The electric excitation element 20 is a pulse power source. The electric signals are electric pulses produced by the pulse power source. The electric excitation element 20 is electrically connected with the two electrodes 40 through conducting wires. The electric pulses are applied to the bistable resistance element 10 by the two electrodes 40. Each of the electric pulses only lasts for about 100 milliseconds. A time period between every two electric pulses is about 60 seconds. The strength of the electric pulse is about 50 volts.

The pressure change is applied to the bistable resistance element 10 by applying pressure pulses directly on the top surface of the bistable resistance element 10 disposed in the atmosphere. Each of the pressure pulses only lasts for about 100 milliseconds. A time period between each two pressure pulses is about 60 seconds. The pressure is about $0.3 N/cm^2$.

Figure 8:
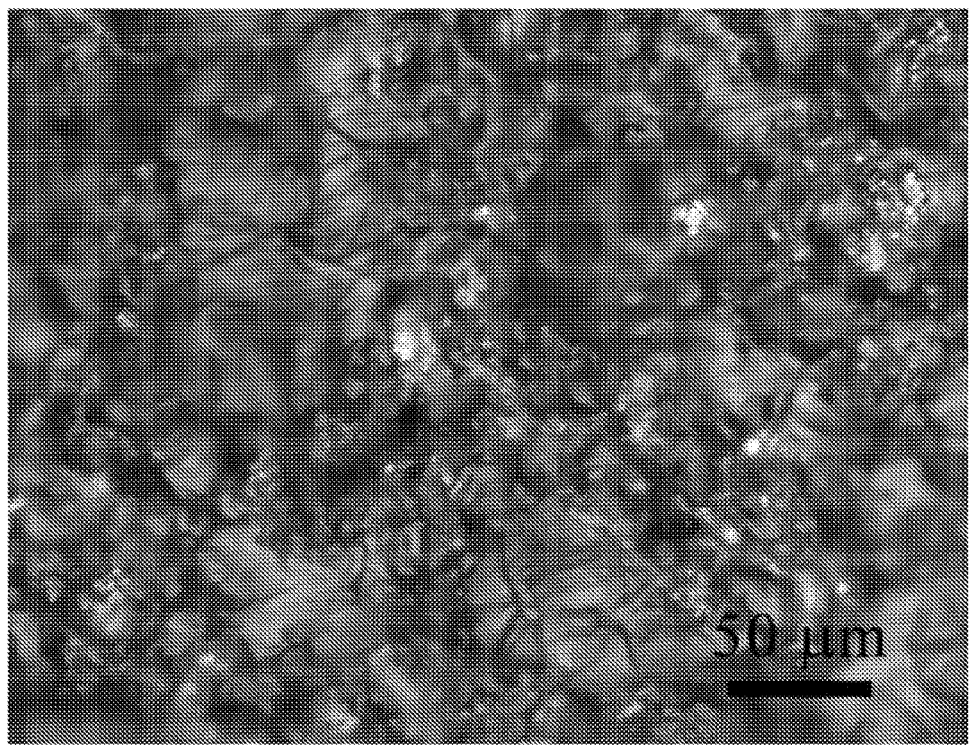
FIG. 8 is a high resolution optical photograph showing a cross section of an embodiment of the bistable resistance element on low resistance state.

Referring to FIG. 8, the filaments can be seen on the photo of the cross section of the bistable resistance element 10 at a low resistance state. The filaments are grown from the nickel particles and contact each other to electrically connect the nickel particles therebetween.

Figure 9:
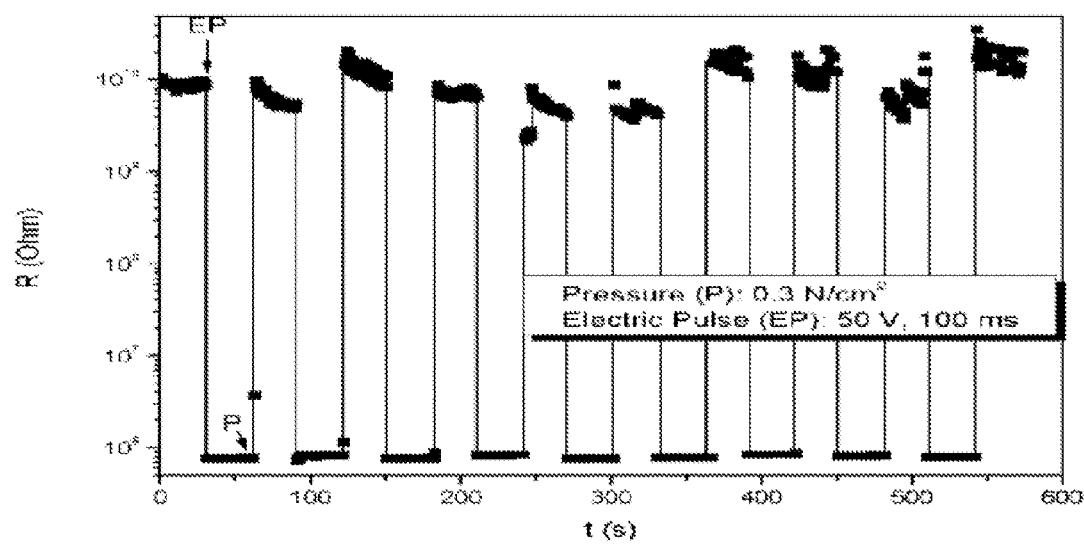
FIG. 9 is a graph showing resistances of the pressure control switch of FIG. 7 varying with pressures and electrical pulses applied thereto.

Referring to FIG. 9, the vertical axis represents the resistance of the bistable resistance element 10. The horizontal axis represents time. As the pressure pulses and the electric pulses are alternatively applied to the bistable resistance element 10, the resistance of the bistable resistance element 10 dramatically changes between about $10^5$ Ohms and about $10^{10}$ Ohms. When the pressure pulse is applied to the bistable resistance element 10, the resistance immediately reaches to about $10^{10}$ Ohms at the high resistance state. When the electric pulse is applied to the bistable resistance element 10, the resistance immediately reaches to about $10^5$ Ohms at the low resistance state.

Example 2

Figure 10:
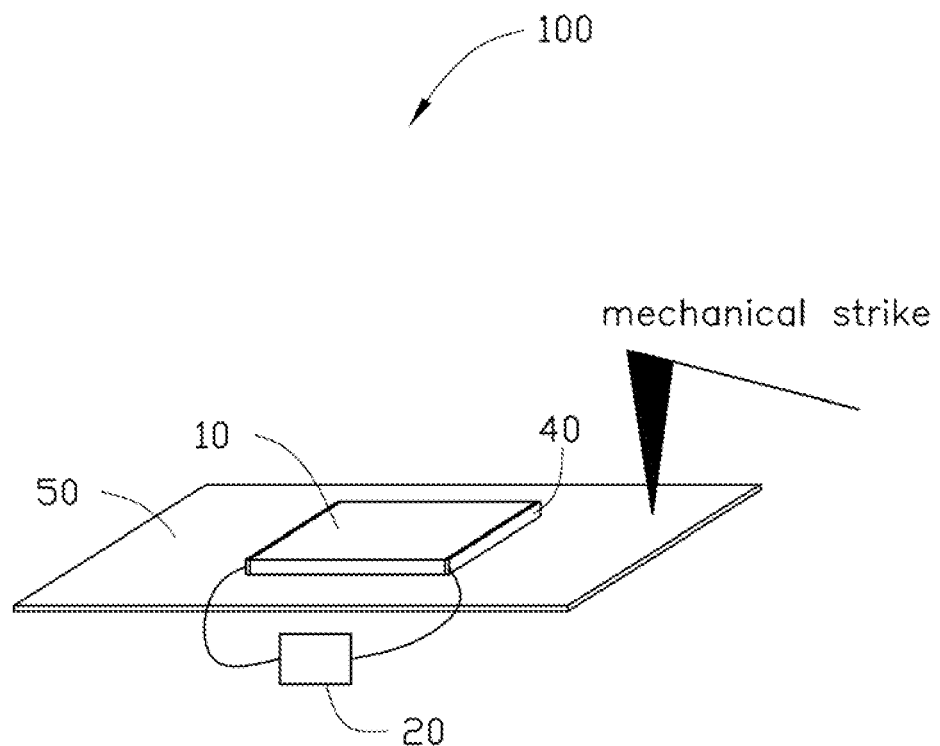
FIG. 10 is an isometric view of another embodiment of a pressure control switch having vibration occurring nearby.

Referring to FIG. 10, the pressure control switch 100 of Example 2 is the same as that in Example 1. However, the pressure change is applied to the bistable resistance element 10 by applying strike pulses on the top surface of the glass board near the bistable resistance element 10 disposed in the atmosphere. Each of the strike pulses only lasts for about 100 milliseconds. A time period between every two strike pulses is about 60 seconds.

Figure 11:
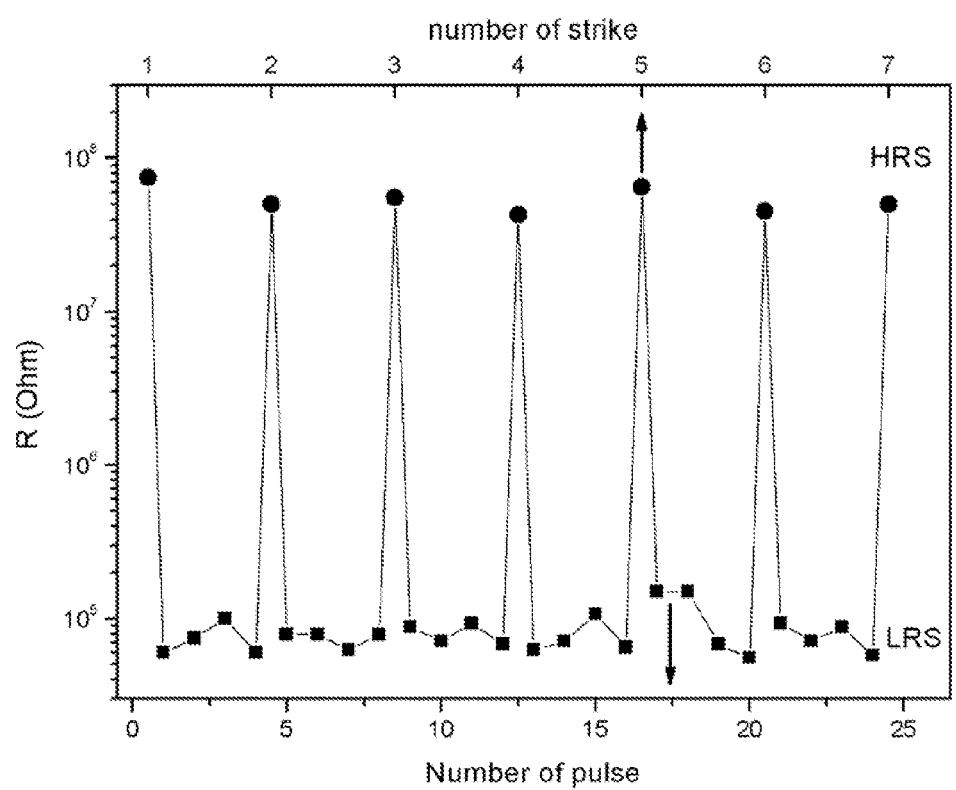
FIG. 11 is a graph showing resistances of the pressure control switch of FIG. 10 varying with pressures and electrical pulses applied thereto.

Referring to FIG. 11, the vertical axis represents the resistance of the bistable resistance element 10, the top horizontal axis represents the number of strike pulses, and the bottom horizontal axis represents the number of electric pulses. The resistance of the bistable resistance element 10 dramatically changes between about $10^4$ Ohms and about $10^8$ Ohms with the strike pulses and the electric pulses. When the strike pulse is applied to the bistable resistance element 10, the resistance immediately reaches about $10^8$ Ohms at the high resistance state. When the electric pulse is applied to the bistable resistance element 10, the resistance immediately reaches to about $10^4$ Ohms at the low resistance state.

Example 3

Figure 12:
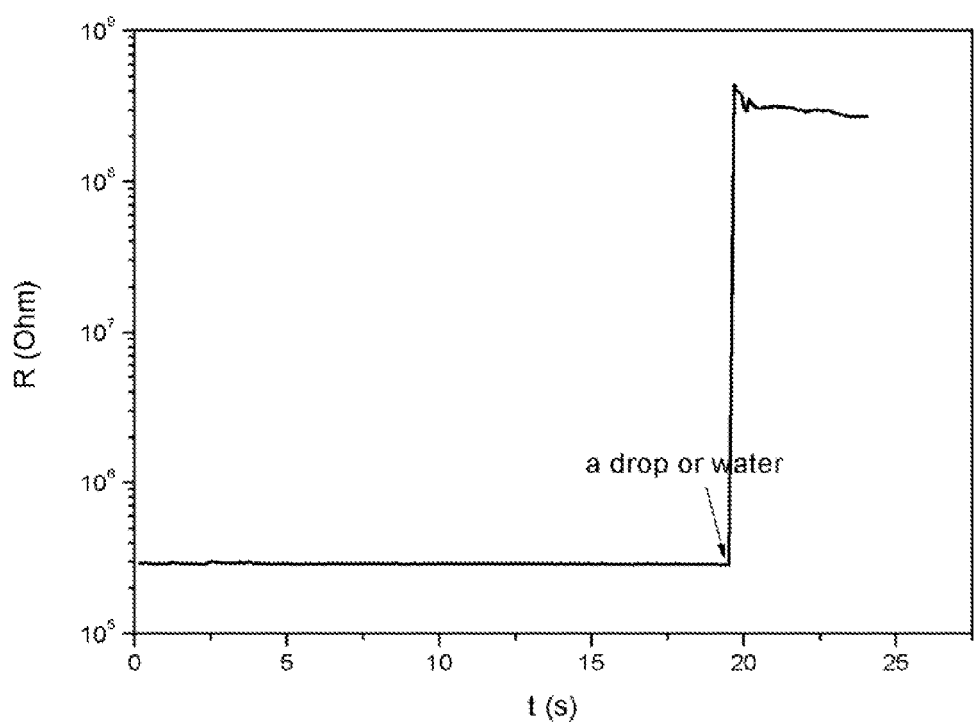
FIG. 12 is a graph showing resistance change of an embodiment of the pressure control switch when water is dropped thereon.

The pressure control switch 100 of the Example 3 only includes the same as the bistable resistance element 10 as in Example 1. The pressure change is applied to the bistable resistance element 10 by applying a drop of water from about 0.5 meters high on the top surface of the bistable resistance element 10 disposed in the atmosphere. Referring to FIG. 12, the vertical axis represents the resistance of the bistable resistance element 10. The horizontal axis represents time. The bistable resistance element 10 is at low resistance state with the resistance of about $0.5 \times 10^6$ Ohms before the water is dropped on the bistable resistance element 10. After the water is dropped on the bistable resistance element 10, the bistable resistance element 10 immediately switches to the high resistance state with the resistance at about $0.5 \times 10^8$ Ohms Depending on the embodiment, certain steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A pressure control switch comprising a bistable resistance element, the bistable resistance element comprising:
    an organic, soft, low-conductivity matrix; and
    a plurality of high conductivity particles dispersed in the matrix,
    wherein the bistable resistance element is capable of switching from a low resistance state to a high resistance state by receiving a pressure increase applied to the bistable resistance element, and is capable of switching from a low resistance state to a high resistance state by receiving a pressure decrease applied to the bistable resistance element.

2. The pressure control switch of claim 1, wherein the bistable resistance element switches from the high resistance state to the low resistance state by receiving an electric signal applied to the bistable resistance element.

3. The pressure control switch of claim 2, wherein the electric signal is at least one of a current, a voltage, and an electric field.

4. The pressure control switch of claim 3, wherein an intensity of the electric field is in a range from about 0.1 V/mm to about 100 V/mm.

5. The pressure control switch of claim 1, wherein a ratio of the high resistance to the low resistance of the bistable resistance element is equal to or larger than 100:1.

6. The pressure control switch of claim 1, wherein the plurality of high conductivity particles are metal particles.

7. The pressure control switch of claim 1, wherein a volume percentage of the metal particles in the bistable resistance element is in a range from about 5% to about 40%.

8. The pressure control switch of claim 1, wherein a diameter of the metal particles is in a range from about 2 nanometers to 20 microns.

9. The pressure control switch of claim 1, wherein at the low resistance state, the bistable resistance element further comprises a plurality of high conductivity filaments extending from surfaces of the plurality of high conductivity particles.

10. The pressure control switch of claim 9, wherein at the high resistance state, at least some of the plurality of conductivity filaments are broken to electrically disconnect some of the high conductivity particles.

11. The pressure control switch of claim 1, wherein a material of the matrix is polydimethyl siloxane, the plurality of high conductivity particles are nickel particles, a diameter of the nickel particles is from about 1 micron to about 6 microns, a volume percentage of the nickel particles in the bistable resistance element is in a range from about 9% to about 11%.

12. The pressure control switch of claim 2 further comprising an electric excitation element to produce the electric signal.

13. The pressure control switch of claim 12 further comprising two electrodes electrically connecting the electric excitation element to the bistable resistance element.

14. The pressure control switch of claim 1 further comprising a pressure excitation element to produce the pressure change.

15. A method for using a pressure control switch comprising:
    providing the pressure control switch comprising a bistable resistance element, the bistable resistance element comprising an organic, soft, low-conductivity matrix and a plurality of high conductivity particles dispersed in the matrix;
    applying an electric signal to the bistable resistance element to change the bistable resistance element from a high resistance state to a low resistance state if the bistable resistance element is at the high resistance state; and
    sensing a pressure change by switching from a low resistance state to a high resistance state of the bistable resistance element.

16. The method of claim 15, further comprising applying the electric signal to the bistable resistance element to switch the bistable resistance element to the low resistance state.

17. The method of claim 15, wherein on different times of switches, a pressure applied to the bistable resistance element at the low resistance state has the same value.

18. The method of claim 15, wherein on different times of switches, a pressure applied to the bistable resistance element at the low resistance state has different values.

19. An alarm system comprising:
- a pressure control switch comprising a bistable resistance element, the bistable resistance element comprising an organic, soft, low-conductivity matrix and a plurality of high conductivity particles dispersed in the matrix, wherein the bistable resistance element is capable of switching from a low resistance state to a high resistance state, by receiving a pressure increase applied to the bistable resistance element, and is capable of switching from a low resistance state to a high resistance state, by receiving a pressure decrease applied to the bistable resistance element;
- an alarming circuit; and
- an alarm;
- wherein the pressure control switch and the alarm are electrically connected with the alarming circuit, and the alarming circuit powers the alarm if the bistable resistance element is at a high resistance state.

\* \* \* \* \*